United States Patent [19]
Itozaki et al.

[11] Patent Number: 5,910,662
[45] Date of Patent: Jun. 8, 1999

[54] SEMICONDUCTOR SUBSTRATE HAVING A SUPERCONDUCTING THIN FILM

[75] Inventors: Hideo Itozaki; Keizo Harada; Naoji Fujimori; Shuji Yazu; Tetsuji Jodai, all of Itami, Japan

[73] Assignee: Sumitomo Electric Industries, Ltd., Japan

[21] Appl. No.: 08/167,437

[22] Filed: Dec. 14, 1993

Related U.S. Application Data

[63] Continuation of application No. 07/939,050, Sep. 3, 1992, abandoned, which is a continuation of application No. 07/733,959, Jul. 22, 1991, abandoned, which is a continuation of application No. 07/290,309, Dec. 27, 1988, abandoned.

[30] Foreign Application Priority Data

| Dec. 26, 1987 | [JP] | Japan | 62-331203 |
| Dec. 26, 1987 | [JP] | Japan | 62-331204 |
| Dec. 26, 1987 | [JP] | Japan | 62-331205 |
| Dec. 26, 1987 | [JP] | Japan | 62-331207 |
| Dec. 26, 1987 | [JP] | Japan | 62-331208 |
| Dec. 26, 1987 | [JP] | Japan | 62-331209 |
| Dec. 26, 1987 | [JP] | Japan | 62-331210 |
| Dec. 26, 1987 | [JP] | Japan | 62-331211 |
| Dec. 26, 1987 | [JP] | Japan | 62-331212 |
| Dec. 26, 1987 | [JP] | Japan | 62-331213 |
| Dec. 26, 1987 | [JP] | Japan | 62-331214 |
| Dec. 26, 1987 | [JP] | Japan | 62-331215 |
| Dec. 26, 1987 | [JP] | Japan | 62-331216 |
| Dec. 26, 1997 | [JP] | Japan | 62-331206 |

[51] Int. Cl.$^6$ ................................................. H01L 29/06
[52] U.S. Cl. ........................ 257/33; 257/35; 257/39; 505/191; 505/237
[58] Field of Search ........................ 357/5, 71; 505/781, 505/785, 1, 776, 777, 779, 782, 191, 234, 237, 239; 427/62, 63; 257/33, 35, 39

[56] References Cited

U.S. PATENT DOCUMENTS

| 4,837,609 | 6/1989 | Gurvitch et al. | 357/71 |
| 4,892,861 | 1/1990 | Ray | 505/785 |
| 4,931,424 | 6/1990 | Henty | 427/62 |

FOREIGN PATENT DOCUMENTS

| 28 20 12 | 9/1988 | European Pat. Off. | H01L 23/48 |

OTHER PUBLICATIONS

Tarascon et al, "3–D Metal Doping (Fe, Co, Ni, Zn) of the High–Tc Perovskite $YBa_2 Cu^3 O_{7-y}$".

High Temperature Superconductors Symposium, Materias Research Society, Nov. 30–Dec. 4, 1987, pp. 523–526.

"Preparation of $Y Ba_2 Cu_3 O_{7-x}$ Superconducting Thin Films by RF–Magne Tron Sputtering", Aida et al, Jap J. Appl. Phys., vol. 30, #9, Sep. 1987, pp. L1489–L11491.

"Microprobe Characterization of Sputtered High TC Superconducting Films on Si and Si $TiO_2$", Lee et al, American Vacuum Society, 34th National Symposium, Nov. 1987.

"High Temperature Superconductivity in Y–Ba–Cu–O: Identification of a Copper–Rich Superconducting Phase", Stacy et al, J. Am. Chem. Soc. vol. 109, #8, Apr. 1987, pp. 2528–2530.

"Growth of High TC Superconducting $Bi_4(Ca,Sr)_6 Cu_4 O_{16+x}$ Crystals", Morris et al. Appl. Phys. Lett, vol. 53, #3, Jul. 1988, pp. 249–251.

Applied Physics Letters, vol. 51, No. 13, Sep. 28, 1987 Preparation and substrate reactions of superconducting Y–Ba–Cu–O films.

Japanese Journal of Applied Physics, vol. 26, No. 9, Sep. 9, 1987; Preparation of $YBa_2Cu_3–O_{7-x}$ Superconducting Thin Films by RF–Magnetron Sputtering.

*Primary Examiner*—Sara Crane
*Attorney, Agent, or Firm*—Bierman, Muserlian and Lucas

[57] ABSTRACT

A semiconductor substrate comprising a single crystal substrate base such a silicon and a superconducting thin film layer deposited on said substrate base and composed of compound oxide such as $Ln_1Ba_2Cu_3O_{7-\delta}$. (Ln is lanthanide).

9 Claims, 1 Drawing Sheet

SEMICONDUCTOR SUBSTRATE HAVING A SUPERCONDUCTING THIN FILM

This application is a continuation of application Ser. No. 07/939,050, filed Sep. 3, 1992, which is a continuation of application Ser. No. 07/733,959, filed Jul. 22, 1991, which in turn, is a continuation of application Ser. No. 07/290,309, filed Dec. 27, 1988 all now abandoned, which claims the priorities of Japanese Application 331203/87 and 331216/87, both filed Dec. 26, 1987.

BACKGROUND OF THE INVENTION

1. Field of the Invention

The present invention rebates to a semiconductor substrate having a superconducting thin film layer, more particularly, it relates to a semiconductor substrate having a superconducting thin film layer composed of a compound oxide.

The superconducting thin film layer of the semiconductor substrate according to the present invention can be used as a wiring material for semiconductor circuits which are built in the semiconductor substrate and for fabricating Josephson junctions for Josephson devices which are built on the semiconductor substrate.

The semiconductor substrate having a superconducting thin film layer according to the present invention can be used for building electronic elements or devices such as superconducting transistors, hot electron transistors or the like.

2. Description of the Related Art

One of the basic technologies for fabricating an integrated circuit on a silicon single crystal substrate is a metallization technology for forming patterned conductor lines which are used for interconnecting a variety of electronic elements which are fabricated by the other basic technology including an insulating layer forming stage, a patterning stage of the insulating layer and an impurity doping stage by means of thermal diffusion, ion implantation or the like. However, a part of the signal current passing through the conventional metallic conductor lines is lost because the cross sectional area of the metallic wiring line is very fine in the case of integrated circuits which are built on the silicon substrate. Therefore, it is demanded to deliver the signal current without current loss.

It is also demanded to increase the transmission velocity of signal current on the conducting lines in addition to increase the operating velocity of the active elements and passive elements themselves in order to improve the net operating velocity of the integrated circuits. However, the improvement in the transmission velocity of signal current through the conventional metallic conductor lines is limited because of the energy loss in the conducting lines. Still more, the increment in the integration degree lead to increment in power consumption owing to Joule heat which is generated in the metallic conducting lines, in other words, the degree of integration in the integrated circuit is limited. Thus, there have been strong demand to use superconductors as a material for the conductor lines.

The supconductivity is a phenomenon which is explained to be a kind of phase change of electrons under which the electric resistance becomes zero and the perfect diamagnetism is observed. However, the critical temperature "Tc" of superconductivity could not exceed 23.2 K of $Nb_3Ge$ which was the the highest Tc for the past ten years, so that they have not used as a wiring material for ICs.

The possibility of an existence of a new type of superconducting material having much higher Tc was revealed by Bednorz and Muller, who discovered a new oxide type superconductor in 1986 [Z.Phys. B64 (1986) 189].

It had been known that certain ceramic materials of compound oxides exhibit the property of superconductivity. For example, U.S. Pat. No. 3,932,315 discloses Ba—Pb—Bi type compound oxide which shows superconductivity and Japanese patent laid-open No. 60-173,885 discloses that Ba—Bi—Pb type compound oxides also show superconductivity. These superconductors, however, possess rather lower transition temperatures of about 10 K and hence usage of liquefied helium (boiling point of 4.2 K) as cryogen is indispensable to realize superconductivity.

The new type compound oxide superconductor discovered by Bednorz and Muller is represented by $[La, Sr]_2CuO_4$ which is called the $K_2NiF_4$-type oxide having a crystal structure which is similar to known perovskite type oxides. The $K_2NiF_4$-type compound oxides show such higher Tc as 30 K which are extremely higher than known superconducting materials.

It was also reported that C. W. Chu et al. discovered, in the United States of America, another superconducting material so called YBCO type represented by $YBa_2Cu_3O_{7-x}$ having the critical temperature of about 90 K in February 1987. Still other types of new superconducting materials which were reported recently are a compound oxide of Bi—Sr—Ca—Cu—O system and Tl—Ba—Ca—Cu—O system which exhibit a Tc of more than 100 K and which are chemically much stable than the abovementioned YBCO type compound oxide or the like.

And hence, the possibility of utilization of high-temperature superconductors as the wiring material for the integrated circuits.

The high-temperature superconductors are also demanded in the electronic devices. A typical application of the superconductor for the electronic devices is Josephson device in which quantum efficiency is observed macroscopically when an electric current is passed through a weak junction arranged between two superconductors. The tunnel junction type Josephson devices is expected to be a high-speed and low-power consuming switching device owing to smaller energy gap of the superconducting material. It is also expected to utilize the Josephson device as high sensitive sensor or detector for sensing very weak magnetic field, microwave, radiant ray or the like since variation of electromagnetic wave or magnetic field is reflected in variation of Josephson effect and can be observed as a precise quantum phenomenon. Development of the superconducting devices such as high-speed logic units or zero power loss wiring materials is also demanded in the field of high-speed computers in which the power consumption per unit area is reaching to the upper limit of the cooling capacity with increment of the integration density in order to reduce energy consumption.

Several ideas or concepts of new devices which are constructed by a combination of semiconductor and superconductor such as a superconducting transistor or a hot electron transistor have been proposed (M. Heiblum et al. "Solid State Electronics" Vol. 24, No. 343–346, 1981), but have not yet realized in a form of actual device.

In order to realize the above-mentioned superconducting devices such a superconducting transistor or hot electron transistor, it is indispensable to prepare such a semiconductor substrate that has a homogeneously deposited superconducting layer.

The present applicant already proposed several processes for preparing the thin films of the high-Tc superconductor on oxide substrate in the following patent applications: U.S. patent application Ser. No. 152,714 filed on Feb. 2, 1988, U.S. patent application Ser. No. 167,895 filed on Mar. 13, 1988, U.S. patent appliation Ser. No. 195,145 filed on May 18, 1988, U.S. patent application Ser. No. 195,147 filed on May 18, 1988, U.S. patent application Ser. No. 200,206 filed on May 31, 1988 or the like.

An object of the present invention is to provide a novel semiconductor substrate having a homogeneously deposited superconductor-ing layer composed of compound oxide.

SUMMARY OF THE INVENTION

The present invention provides a semiconductor substrate comprising a substrate base composed of a single crystal of semiconductor material and a superconducting thin film layer deposited on said substrate base, characterized in that said superconducting thin film is composed mainly of compound oxide.

The semiconductor material of which the substrate base is composed is preferably selected from a group comprising Si, 3C—SiC, 6H—Sic, GaAs, GaP, InP, InSb, ZnSe, CdTe, HgCdTe, GaAlAs, GaInAs, InAlAs and InGaAsP. The substrate base is preferably composed of single crystal of these semiconductor materials.

The superconducting thin film layer which can be used in the present invention can be any one of compound oxide type superconducting materials.

According to a preferred embodiment of the present invention, the superconducting thin film layer is composed mainly of a compound oxide of at least one element $\alpha$ selected from IIa group of the Periodic Table, at least one element $\beta$ selected from IIIa group of the Periodic Table and at least one element $\gamma$ selected from a group comprising Ib, IIb, IIIb, IVa and VIIIa groups of the Periodic Table.

One example of this type compound oxide is represented by the general formula:

$$(\alpha_{1-x}\beta_x)_\gamma_y O_z$$

in which $\alpha$, $\beta$ and $\gamma$ have the same definition as above, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfies ranges of $0.4 \leq y \leq 3.0$ and $1 \leq z \leq 5$ respectively. The element $\alpha$ of IIa group element is preferably Ba, Sr, Ca, Mg, Be or the like. More preferably the element $\alpha$ is Ba and Sr from 10% to 80% of which may be replaced by one or two elements selected from a group comprising Mg and Ca. The element $\beta$ of IIIa group element is preferably lanthanide such as Y, La, Sc, Ce, Gd, Ho, Er, Tm, Yb or Lu. More preferably the element $\beta$ is Y, La or Ho from 10% to 80% of which may be replaced by Sc or one or two elements selected from a group comprising the other lanthanide elements. The $\gamma$ is copper a part of which can be replaced by the other element selected from a group comprising Ib, IIb, IIIb, IVa and VIIIa groups of the Periodic Table such as Ti or V. Particulary, the superconducting thin film of this type compound oxide is preferably a compound oxide preferably represented by the general formula:

$$(La_{1-x}\alpha_x)_2CuO_4$$

in which $\alpha$ stands for Ba or Sr. These compound oxides are considered to be composed mainly of perovskite type or oxygen deficient perovskite type crystalline structure.

Another example of the above-mentioned compound oxide is a so called YBCO type compound oxide represented by the general formula:

$$Ln_1Ba_2Cu_3O_{7-\delta}$$

in which Ln stands for at least one lanthanide element selected from a group comprising La, Nd, Sm, Eu, Gd, Dy, Ho, Y, Er, Yb, Tm and Lu and $\delta$ is a number which satisfies a range of $0 \leq \delta < 1$. Namely this type compound oxide are following systems:

$$Y_1Ba_2Cu_3O_{7-\delta}, Ho_1Ba_2Cu_3O_{7-\delta}, Lu_1Ba_2Cu_3O_{7-\delta},$$

$$Sm_1Ba_2Cu_3O_{7-\delta}, Nd_1Ba_2Cu_3O_{7-\delta}, Gd_1Ba_2Cu_3O_{7-\delta},$$

$$Eu_1Ba_2Cu_3O_{7-\delta}, Er_1Ba_2Cu_3O_{7-\delta}, Dy_1Ba_2Cu_3O_{7-\delta},$$

$$Tm_1Ba_2Cu_3O_{7-\delta}, Yb_1Ba_2Cu_3O_{7-\delta}, La_1Ba_2Cu_3O_{7-\delta}$$

in which $\delta$ is a number which satisfies a range of $0 < \delta < 1$ and possess preferably perovskite type or quasi-perovskite type crystal structure. The term quasi-perovskite type means a structure which can be considered to have such a crystal structure that is similar to perovskite-type oxides and includes an orthorhombically distorted perovskite or a distorted oxygen-deficient perovskite or the like.

An atomic ratio of the lanthanide element "Ln":Ba:Cu is preferably 1:2:3 as is defined by the formula but the atomic ratio is not restricted strictly to this ratio. In fact, the other compound oxides having different atomic ratios which are deviate from the above-mentioned value by 10% may exhibit superconductivity property.

Still another example of the above-mentioned compound oxide is compound oxides represented by the general formula:

$$\Theta_4(\Phi_{1-q}, Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0<q<1$, and r is a number which satisfies a range of $-2 \leq r \leq +2$. Namely, this type compound oxide include the following systems:

$$Bi_4Sr_4Ca_4Cu_6O_{20-r}, Bi_2Sr_2Ca_2Cu_3O_{10-r},$$

$$Tl_4Ba_4Ca_4Cu_6O_{20-r}, Tl_2Ba_2Ca_2Cu_3O_{10-r}$$

in which r is a number which satisfies a range of $-2 \leq r \leq +2$.

When electronic systems or a semiconductor devices are fabricated in the semiconductor substrate according to the present invention, the superconducting thin film layer can be removed locally by etching technique or the like so that the superconducting thin film layer is shaped into a desired pattern.

The superconducting thin film layer deposited on the semiconductor substrate according to the present invention can be used as a writing material for semiconductor circuits which are built in the substrate base.

The semiconductor substrate according to the present invention can be used also as a substrate for fabricating an integrated circuit for building novel superconducting elements or as a substrate on which electronic devices are built. For example, Josephson junctions can be fabricated in the superconducting thin film to build Josephson devices. The semiconductor substrate according to the present invention can be used also for fabricating high-speed semiconductor devices such as superconducting transistors having more than three electrodes, superconducting FETs or hot electron transistors which utilize the interface between the superconducting thin film layer and the semiconductor substrate as is shown in FIG. 1.

BRIEF DESCRIPTION OF THE DRAWINGS

FIG. 1 shows the concept of the superconducting transistor. The superconducting transistor comprises a single crystal substrate 3 of semiconductor and a superconducting thin film layer 1 deposited on a surface of the substrate 3. FIG. 1 illustrates also the conventional insulator layers 2 and 4 and a special shape of the superconducting transistor which can be fabricated by the conventional lithography and etching technique. In this superconducting transistor, superconducting current pass through an active channel 3' of the semiconductor 3 by the "contact effect" of superconductor segments or electrodes 1' and 1" and is controlled by a gate 5.

Figure 1:
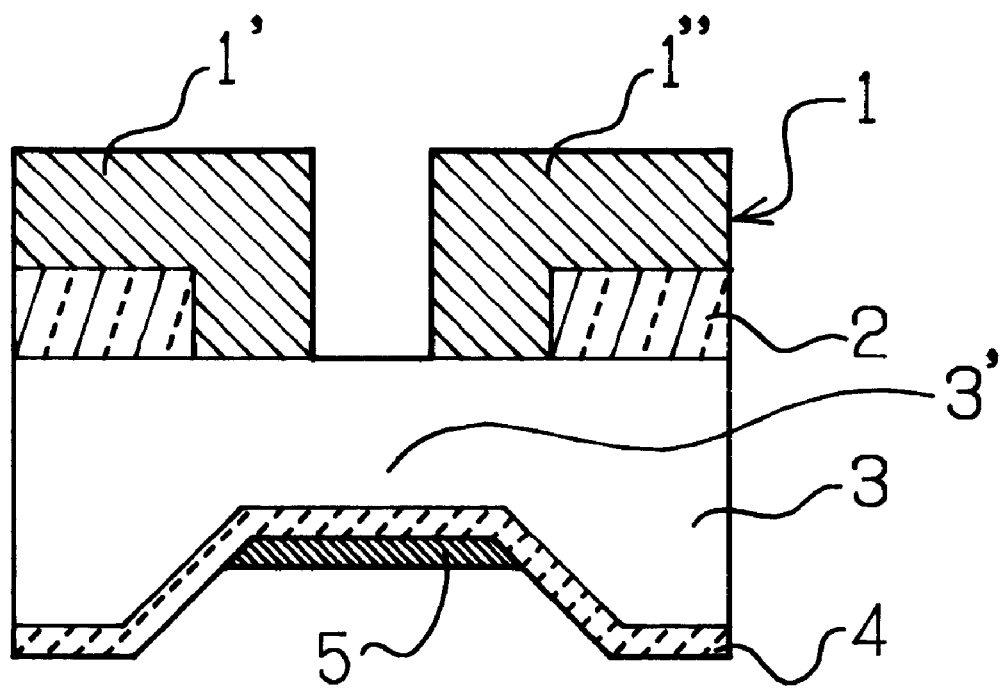
FIG. 1 shows an illustrative cross sectional view of a semiconductor transistor to which the semiconductor substrate according to the present invention is applicable.

For example, the superconducting transistor can be fabricated as following: At first, the insulator layer 2 is formed by the conventional oxidation technique on the semiconductor substrate 3 and then is etched into a desired pattern. Then, the superconducting thin film layer 1 according to the present invention is deposited. The deposited superconducting thin film 1 is then divided into two the superconductor electrodes 1' and 1" by ion etching technique. Another insulator layer 4 is formed on the opposite surface of the semiconductor substrate 3 which has been etched previously. A gate electrode 5 is deposited by the conventional metallization technique.

Now, we will describe a process for producing the above-mentioned semiconductor substrate according to the present invention.

The semiconductor substrate according to the present invention is prepared by depositing the superconducting thin film layer on a single crystal of semiconductor material.

The deposition of the superconducting thin film layer can be effected by physical vapour deposition (PVD) technique such as sputtering, vacuum-deposition, molecular beam epitaxy (MBE), ion beam deposition or the like or by chemical vapour deposition (CVD) technique such as thermal CVD, plasma CVD, photo CVD, MOCVD or the like. Among the physical deposition (PVD) techniques, magnetron sputtering is most preferable.

According to one aspect of the present invention, the deposition must be carried out under a such condition that the semiconductor substrate of single crystal is not heated higher than 700° C. If the substrate temperature exceed 700° C., the quality of the semiconductor single crystal is spoiled and also a reaction occur between the semiconductor material and the compound oxide of which the superconducting thin film is composed. To the contrary, if the substrate temperature is not higher than 200° C., it is impossible or difficult to prepare the superconducting thin film having desired properties.

The superconducting thin film is preferably deposited on plane or {100} plane in order to assure orientation of crystalline structure of the superconducting thin film deposited. In fact, the superconducting thin films of the above-mentioned type compound oxides shows anisotropy in the critical current density. Namely, the current passing along a direction which is in parallel with a plane defined by a-axis and b-axis of the crystal show a very high critical current density, while the current passing along the other directions is relatively lower. Therefore, in order to match the crystalline orientation of the superconducting thin film with that of the semiconductor substrate, it is preferable to deposit the superconducting thin film on the specified plan, preferably {001} plane of the semiconductor single crystal. In the special application, it is also possible to use {110} plane. In this case, the c-axis of the superconducting thin film become in parallel with a surface of a substrate, so that current is flown perpendicularly with respect to the c-axis.

According to an embodiment of the present invention, a buffer layer can be interposed between the superconducting thin film layer and the semiconductor substrate. The buffer layer is deposited on the single crystal of semiconductor material before the deposition of the the superconducting thin film layer. The function of this buffer layer is to improve the orientation or crystallization of the superconducting thin film layer. The buffer layer is preferably composed of MgO.

Now, the present invention will be described with reference to examples, but the scope of the present invention should not be limited thereto.

EXAMPLE 1

In this example, a buffer layer of MgO having a thickness of 500 Å is deposited on a single crystal of silicon substrate before the superconducting thin film layer is deposited.

The MgO buffer layer is deposited by sputtering technique on {100} plane of the silicon substrate which is heated at 650° C.

Two samples are prepared by depositing two superconducting thin film layers of Y—Ba—Cu—O system and Ho—Ba—Cu—O system on the MgO buffer layer respectively. Each of two superconducting thin films is deposited by magnetron RF sputtering technique which is itself known. Targets used in the sputtering are sintered powder of $Yba_2Cu_{4.5}O_x$ for Y—Ba—Cu—O system and $HoBa_{2.2}Cu_{4.7}O_x$ for Ho—Ba—Cu—O system respectively. Special attention is paid to the distance between the substrate and the target and to the power of high-frequency, while the silicon substrate is heated at 700° C. during the sputtering operation so that superconducting thin film layers of the respective compound oxides are grown to 1000 Å.

The resulting samples of semiconductor substrates having the superconducting thin film layer who good condition at an interface between the semiconductor substrate and the superconductting thin film layer, Table 1 shows the critical temperature Tco (a temperature where the phenomenon of superconductivity start to be observed), Tci (a temperature where zero resistance is observed) and the critical current density determined at 77 K of the superconducting thin films of respective samples.

TABLE 1

| Superconducting thin film | Critical temperature Tco (K) | Tci (K) | Critical current density (A/cm²) |
|---|---|---|---|
| $Y_1Ba_2Cu_3O_{7-x}$ | 96 | 91 | $3.0 \times 10^5$ |
| $Ho_1Ba_2Cu_3O_{7-x}$ | 98 | 94 | $3.2 \times 10^5$ |

EXAMPLE 2

The same operation as Example 1 is repeated except that the buffer layer is not used and semiconductor substrate of silicon is replaced by respective single crystal of 3C—SiC, 6H—Sic, GaAs, GaP, InP, InSb, ZnSe, CdTe, HgCdTe, GaAlAs, GaInAs, InAlAs and InGaAsP.

For each substrate, two samples are prepared by depositing two superconducting thin film layers of Y—Ba—

Cu—O system and Ho—Ba—Cu—O system on {100} plane or {110} plane by magnetron RF sputtering technique which is itself known. Targets used in the sputtering are sintered powders of $Yba_2Cu_{4.5}O_x$ for Y—Ba—Cu—O system and $HoBa_{2.2}Cu_{4.7}O_x$ for Ho—Ba—Cu—O system respectively. Special attention is paid to the distance between the substrate and the target and to the power of high-frequency, while the silicon substrate is heated at 700° C. during the sputtering operation so that superconducting thin film layers of the respective compound oxides are grown to 1000 Å.

The resulting samples of semiconductor substrates having the superconducting thin film layer show good condition at an interface between the semiconductor substrate and the superconducting thin film layer. Table 2 shows the critical temperature Tco (a temperature where the phenomenon of superconductivity start to be observed), Tci (a temperature where zero resistance is observed) and the critical current density determined at 77 K of the superconducting thin films of respective samples.

TABLE 2

| Semiconductor single crystal | Plane depost. | Superconducting thin film | Criticl. temp. (K) Tco | Tci | Crticl. current density (A/cm²) |
|---|---|---|---|---|---|
| 3C—SiC | 100 | YBaCuO | 96 | 91 | $3.0 \times 10^5$ |
| 6H—SiC | 0001 | (1) | 89 | 86 | $2.5 \times 10^5$ |
| GaAs | 100 | | 89 | 85 | $2.8 \times 10^5$ |
| GaP | 110 | | 83 | 80 | $2.2 \times 10^5$ |
| InP | 100 | | 84 | 81 | $2.3 \times 10^5$ |
| InSb | 100 | | 86 | 84 | $3.3 \times 10^5$ |
| ZnSe | 100 | | 87 | 85 | $2.9 \times 10^5$ |
| CdTe | 100 | | 87 | 84 | $3.2 \times 10^5$ |
| HgCdTe | 100 | | 84 | 81 | $2.9 \times 10^5$ |
| GaAlAs | 100 | | 87 | 84 | $2.2 \times 10^5$ |
| GaInAs | 100 | | 86 | 84 | $2.5 \times 10^5$ |
| InAlAs | 100 | | 87 | 85 | $2.1 \times 10^5$ |
| InGaAsP | 100 | | 82 | 80 | $2.6 \times 10^5$ |
| 3C—SiC | 100 | HoBaCuO | 98 | 94 | $3.2 \times 10^5$ |
| 6H—SiC | 0001 | (2) | 92 | 90 | $3.1 \times 10^5$ |
| GaAs | 100 | | 88 | 86 | $3.0 \times 10^5$ |
| GaP | 110 | | 89 | 87 | $3.2 \times 10^5$ |
| InP | 100 | | 91 | 88 | $2.9 \times 10^5$ |
| InSb | 100 | | 84 | 82 | $3.0 \times 10^5$ |
| ZnSe | 100 | | 89 | 86 | $3.4 \times 10^5$ |
| CdTe | 100 | | 86 | 84 | $3.4 \times 10^5$ |
| HgCdTe | 100 | | 83 | 82 | $2.8 \times 10^5$ |
| GaAlAs | 100 | | 84 | 82 | $2.6 \times 10^5$ |
| GaInAs | 100 | | 89 | 86 | $2.8 \times 10^5$ |
| InAlAs | 100 | | 88 | 86 | $2.9 \times 10^5$ |
| InGaAsP | 100 | | 84 | 83 | $2.7 \times 10^5$ |

Note:
(1) $Y_1Ba_2Cu_3O_{7-x}$
(2) $Ho_1Ba_2Cu_3O_{7-x}$

EXAMPLE 3

The same operation as Example 1 is repeated except that a superconducting thin film of Bi—Sr—Ca—Cu—O system is deposited on the silicon substrate through the MgO buffer layer in place of Y—Ba—Cu—O system in Example 1 by using a target of $Bi_{1.4}Sr_1Ca_1Cu_{1.5}O_x$.

The resulting semiconductor substrate having the superconducting thin film layer of Bi—Sr—Ca—Cu—O system on the MgO buffer layer deposited on silicon substrate shows good condition at the interface between the buffer layer and the superconducting thin film layer. Table 3 shows the critical temperatures Tco and Tci of the superconducting thin film.

TABLE 3

| Superconducting thin film | Critical temperature Tco (K) | Tci (K) | Critical current density (A/cm²) |
|---|---|---|---|
| $Bi_2Sr_2Ca_2Cu_3O_x$ | 113 | 102 | $3.0 \times 10^4$ |

We claim:
1. A semiconductor substrate-superconducting thin film composite comprising a single crystal semiconductor substrate, a superconducting thin film layer of compound oxide and an MgO buffer layer interposed between said semiconductor substrate and said superconducting layer, wherein said semiconductor substrate is made of a semiconductor selected from the group consisting of 3C—SiC, 6H—SiC, GaAs, GaP, InP, InSb, ZnSe, CdTe, HgCdTe, GaInAs, InAlAs and InGaAsP and said compound oxide is composed of at least one element selected from Group IIa of the Periodic Table, at least one element selected from Group IIIa of the Periodic Table, and copper.

2. The composite set forth in claim 1, characterized in that said superconducting thin film layer is composed mainly of a compound oxide represented by the general formula:

$$(\alpha_{1-x}\beta_x)\gamma_yO_z$$

in which α, β and γ have the same definition as above, x is an atomic ratio of β with respect to (α+β) and has a range of $0.1 \leq x \leq 0.9$, and y and z are respective atomic ratios with respect to $(\alpha_{1-x}\beta_x)$ which is considered to be equal to 1 and each satisfies ranges of $0.4 \leq y \leq 3.0$ and $1 \leq z \leq 5$ respectively.

3. The composite set forth in claim 2, characterized in that said superconducting thin film layer is composed of a compound oxide represented by the general formula:

$$(La_{1-x}\alpha_x)_2CuO_4$$

in which α stands for Ba or Sr.

4. The composite set forth in claim 2, characterized in that said superconducting thin film layer is composed of an oxide having perovskite typo or oxygen deficient perovskite type crystalline structure.

5. The composite set forth in claim 1, characterized in that said compound oxide contain further at least one elements selected from a group comprising Al, Fe, Co, Ni, Zn, Ag and Ti.

6. The composite set forth in claim 1, characterized in that superconducting thin film layer is composed mainly of a compound oxide represented by the general formula:

$$Ln_1Ba_2Cu_3O_{7-\delta}$$

in which Ln stands for at least one lanthanide element selected from a group comprising La, Nd, Sm, Eu, Gd, Dy, Ho, Y, Er, Yb, Tm and Lu and ε is a number which satisfies a range of $0 \leq \epsilon < 1$.

7. The composite set forth in claim 6, characterized in that the Ln is Y, Er, Ho or Dy.

8. The composite set forth in claim 6, characterized in that said compound oxide contain further at least one of element selected from a group comprising Al, Fe, Co, Ni, Zn, Ag and Ti.

9. The composite set forth in claim 1, characterized in that said superconducting thin film layer is composed mainly of a compound oxide represented by the general formula:

$$\Theta_4(\Phi_{1-q}, Ca_q)_m Cu_n O_{p+r}$$

in which Θ stands for Bi or Tl, Φ stands for Sr when Θ is Bi and stands for Ba when Θ is Tl, m and n are numbers each satisfying ranges of $6 \leq m \leq 10$ and $4 \leq n \leq 8$ respectively, $p=(6+m+n)$, q is a number which satisfies a range of $0<q<1$, and r is a number which satisfies a range of $-2 \leq r \leq +2$.

* * * * *